United States Patent [19]

Lerner

[11] 4,189,722

[45] Feb. 19, 1980

[54] SWIMMING POOL INTRUSION ALARM SYSTEM

[76] Inventor: Julius O. Lerner, 460 NW. 41 St., Pompano Beach, Fla. 33064

[21] Appl. No.: 852,437

[22] Filed: Nov. 17, 1977

Related U.S. Application Data

[63] Continuation-in-part of Ser. No. 738,523, Nov. 3, 1976, abandoned.

[51] Int. Cl.[2] .......................... G08B 21/00; H03B 5/00

[52] U.S. Cl. .................................. 367/93; 73/290 V; 331/65; 340/565; 340/621

[58] Field of Search .................... 340/244 R, 246, 261, 340/565, 566, 558, 618, 621; 73/290 V; 331/65, 117 D, 96

[56] References Cited

U.S. PATENT DOCUMENTS

| | | | |
|---|---|---|---|
| 2,584,128 | 2/1952 | Hildyard | 73/290 V X |
| 2,783,459 | 2/1957 | Lienau et al. | 340/244 R |
| 3,058,101 | 10/1962 | Malvini | 340/565 |
| 3,100,885 | 8/1963 | Welkowitz et al. | 340/244 R X |
| 3,213,438 | 10/1965 | Felice et al. | 340/244 R |
| 3,222,664 | 12/1965 | Premack | 340/244 R X |
| 3,241,368 | 3/1966 | Newitt | 340/244 R X |
| 3,312,107 | 4/1967 | Burns et al. | 73/290 V |
| 3,693,445 | 9/1972 | Johnson | 73/290 V |

*Primary Examiner*—John W. Caldwell, Sr.
*Assistant Examiner*—Daniel Myer
*Attorney, Agent, or Firm*—Malin & Haley

[57] ABSTRACT

The present apparatus is designed to determine the presence of an intruder in a swimming pool by detecting a predetermined change in water level caused by displacement. The surface of the pool water forms the lower boundary of an air filled acoustic cavity, and cavity resonance is excited therein by a sonic transducer coupled to the cavity and also to a signal amplifier, causing the cavity to determine the frequency of oscillation of the feedback amplifier. A rise in water level caused by intruder displacement decreases the vertical dimension of the cavity so that the cavity has a different resonant frequency than before intrusion, and the amplifier therefore oscillates at a different frequency. The predetermined change in amplifier signal output frequency is sensed by an electrical network and converted to an alarm device activating signal to indicate an intrusion.

8 Claims, 6 Drawing Figures

Fig. 1.

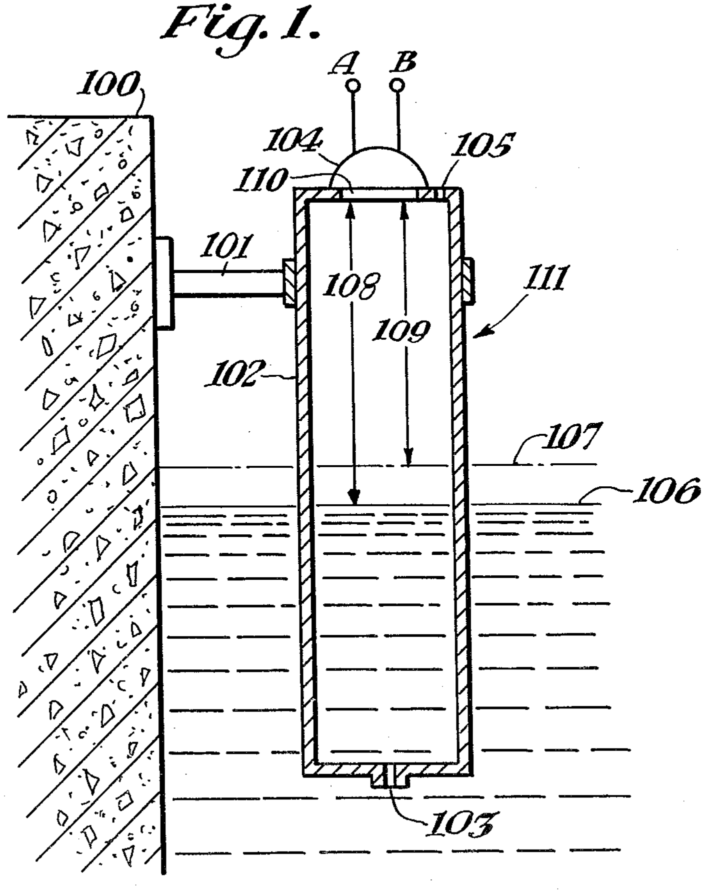

EQUATION: $h = H\,\epsilon^{-\frac{t}{R_A V_C}}$

Where: h = relative instantaneous water level in chamber.

H = new average hydraulic head.

$\epsilon$ = base of natural logarithm, 2.718.

$H_0$ = initial average reference hydraulic head.

t = a predetermined time, seconds after start.

$R_A$ = duct resistance to fluid flow.

$V_C$ = fluid chamber cubic volume up to new average hydraulic head.

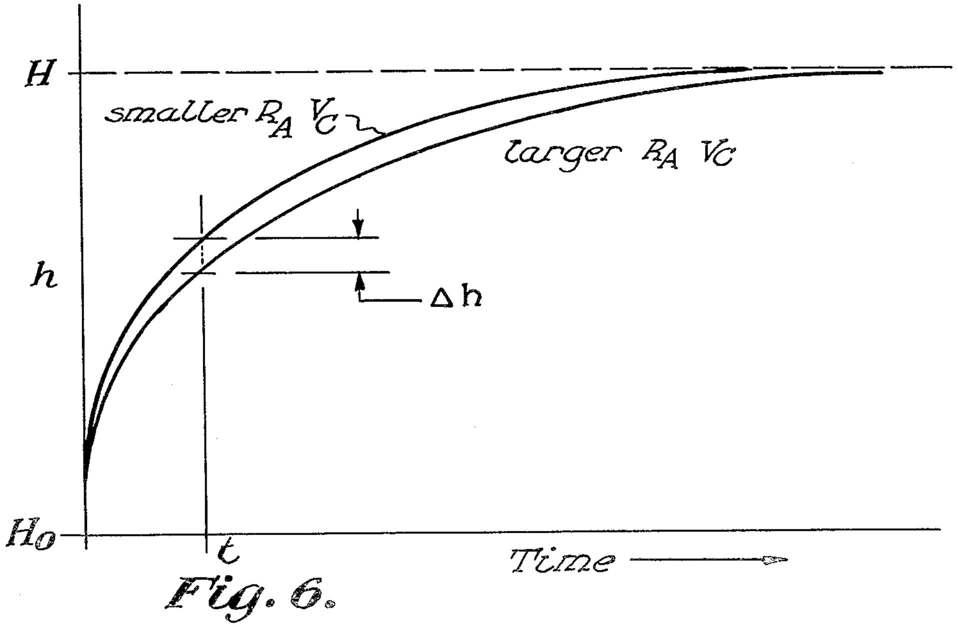

Fig. 6.

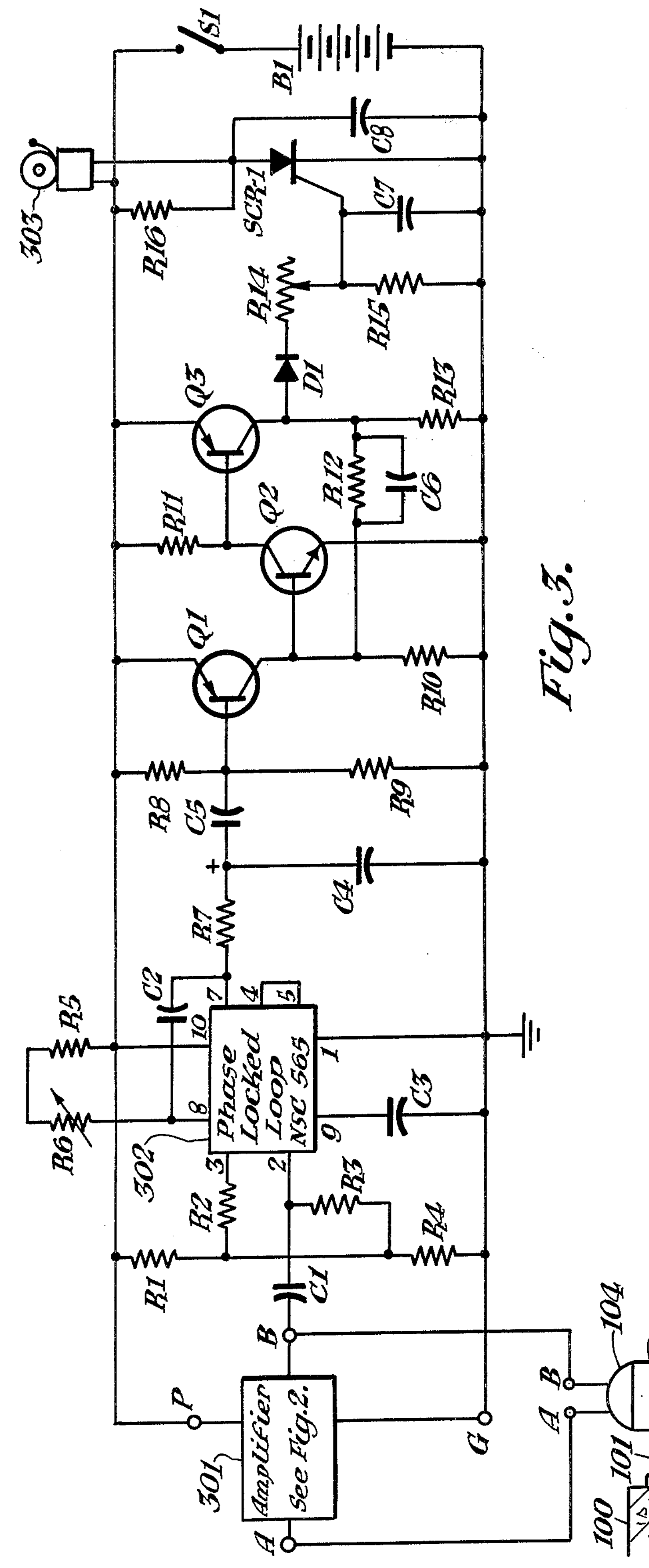
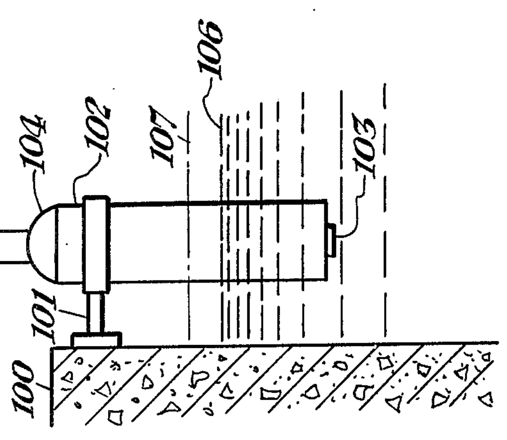
Fig. 3.
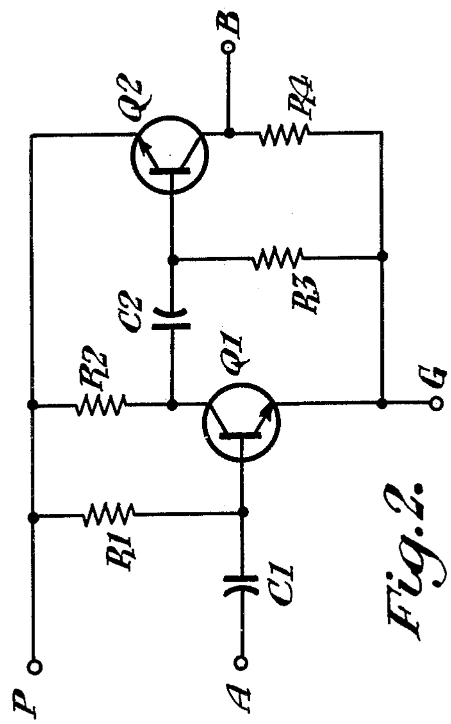
Fig. 2.

SWIMMING POOL INTRUSION ALARM SYSTEM

CROSS-REFERENCE TO RELATED APPLICATION

The present application is a continuation-in-part of my co-pending application, Ser. No. 738,523, filed Nov. 3, 1976, now abandoned.

BACKGROUND OF THE INVENTION

It is the purpose of the present continuation in part application to describe a simplified and improved embodiment over that disclosed in my co-pending application, Ser. No. 738,523, filed Nov. 3, 1976 now abandoned. This invention permits the detection of the presence of a child in the protected swimming pool in time to prevent drowning. The apparatus of the present invention can detect the presence of a child in the pool whether he falls in or enters the water gently. The present apparatus can be installed at any location on the pool or even at a remote location and connected to pool water by pipe or syphon without range or sensitivity problems. Unlike the prior art, the apparatus of the present invention does not respond to waves, ambient sound, water pressure or transitory water disturbance, nor does the present invention utilize floats or moving mechanical parts which have troubled the prior art.

SUMMARY OF THE INVENTION

In the apparatus of the present invention propagated wave resonant cavity apparatus is utilized to sense relative water level. Hydraulic integrating apparatus utilizing the lower portion of said hollow body as a water capacity chamber analogous to an electrical capacitor, and a duct or syphon tube of predetermined resistance to water flow admitting water to said hollow body, analogous to electrical resistance, to comprise a hydraulic integrator analogous to an electrical RC integrator. The output signal from said sensing and integrating apparatus is a frequency proportionate to relative average water level. In the absence of an intruder, said frequency has a steady value which is herein termed the reference value signal. When an intrusion occurs, water level rises to cause an increase in frequency which is sensed by an electrical network responsive to phase or frequency change to produce an alarm device actuating signal.

Although the preferred embodiment utilizes a reciprocal sound transducer, this disclosure teaches that a microwave radio frequency transducer with said hollow body conductive, and a microwave frequency amplifier and suitable frequency networks could be utilized. Further, it should be noted that although a cylindrical body is described, other forms can be utilized. For example, a solid resonatable body can be utilized. Also, while a preferred non-inverting amplifier is shown, others known to the art are suitable. While a preferred phase and frequency responsive network is shown, other known to the art are suitable. While a preferred triggerable, latching alarm network is shown, others known to the art are suitable.

OBJECTS OF THIS INVENTION

To provide an improved swimming pool intrusion signal system including an output signal and an alarm unresponsive to waves, ambient noise, transitory water disturbance, water pressure, rain or evaporation.

To provide a swimming pool intrusion system without floats or moving mechanical parts.

To provide a swimming pool intrusion system alarm which does not require readjustment for change in water level due to rain or evaporation.

To provide a swimming pool intrusion alarm apparatus having equal detection sensitivity at any location on the pool.

BRIEF DESCRIPTION OF THE DRAWINGS

FIG. 1 is a cross-sectional side view of a portion of a pool and the detecting apparatus including a transducer.

FIG. 2 is a schematic of the amplifier.

FIG. 3 is an illustration of a first embodiment of the swimming pool intrusion signal system showing the detecting apparatus shown in FIG. 1, the amplifier shown in FIG. 2 and the control and alarm circuit, partially in block form and partially in schematic form.

FIG. 6 displays a pair of curves, and their equation, showing rate of change of fluid level in each chamber of the apparatus of FIGS. 1, 3, 4, or 5, with time when an increase in body of water hydraulic head occurs, and showing delta h, the operative quantity in the apparatus of this invention.

DESCRIPTION OF THE PREFERRED EMBODIMENTS

Figure 4:
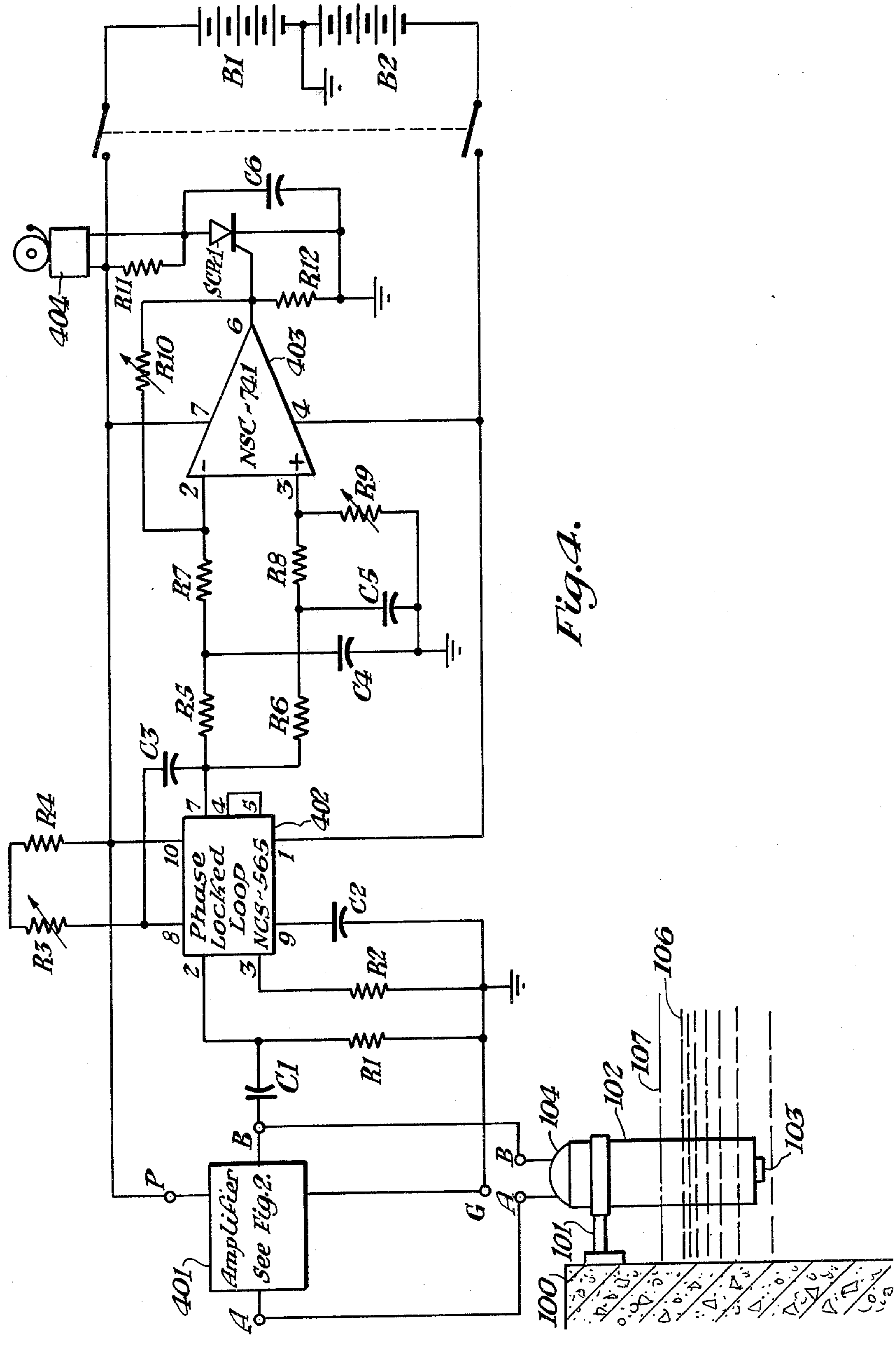
FIG. 4 is another embodiment of the control and alarm circuits partially in block form and partially in schematic form.

Referring now to FIG. 1 which shows the detecting apparatus, The drawing is a sectional view through the axis, viewed in the plane of the paper, of hollow cylindrical body 102 mounted vertically by bracket 101 to pool side 100, partially immersed, vented to atmosphere by vent hole 105, and with pool water admitted to the interior of said body by duct 103, said duct offering predetermined resistance to water flow. Initial or reference water level 106, variable to water level 107, and air space over said contained water within said body having a principal dimension 108 variable to dimension 109. Reciprocal transducer 104 is mounted to cover hole 110 at the upper end of body 102, so that said transducer is operatively coupled to air space within body 102. Transducer 104 has connection terminals A and B.

FIG. 2 shows a non-inverting amplifier network comprised of coupling capacitors C1, C2, transistors Q1, Q2, bias resistors R1, R3, collector load resistors R2, R4, input terminal A, output terminal B, positive power terminal P, negative power return and signal return terminal G.

FIG. 3 shows the circuit network of a first embodiment of the present invention, comprised of the apparatus of FIG. 1 with terminals A and B connected to the respective terminals of the amplifier of FIG. 2, and output terminal B of said amplifier coupled through capacitor C1 to input terminal 2 of phase locked loop integrated circuit 302 comprising integrated circuit NSC 565, made by the National Semiconductor Corp. Said integrated circuit is utilized with bias resistors R1, R2, R3, R4, programming resistors R5, R6, programming capacitor C3, bypass capacitor C2, a low pass network comprised of resistor R7 and capacitor C4. The signal output of said phase locked loop network from terminal 7 connected through said low pass network through coupling capacitor C5 to the input of a PNP inverting amplifier comprised of transistor Q1, bias resistors R8, R9, and load resistor R10. The output of said inverting amplifier is direct connected to the input of a triggerable regenerative pulse forming network comprised of NPN transistor Q2, PNP transistor Q3, load resistors R11, R13, feedback resistor R12, feedback capacitor C6, blocking diode D1. The OUtput of said pulse forming network from the cathode of diode D1 is direct connected to a pulse summing network comprised of resistors R14, R15, and capacitor C7. The output of said pulse summing network is connected to the input of a triggerable, latching, alarm switching network comprised of silicon controlled rectifier SCR-1, load resistor R16, and bypass capacitor C8. Alarm bell 303 is connected across load resistor R16. The apparatus is powered by battery B1 through switch S1.

Referring to the system shown in FIG. 3 and its operation, the apparatus of FIG. 1 is shown mounted at pool side with body 102 half immersed to initial water level 106. When no intruder has entered the pool, the water level within the chamber of wave resonatable body 102 has an average and steady reference level, stabilized by the integrating action of said chamber water capacity together with said flow resistive duct. Resonatable herein denotes "capable of being made to resonate". The air space above water within body 103 has a vertical dimension 108 comprising the largest internal dimension of said chamber which determines the lowest frequency of cavity resonance. Transducer 104 is connected as a signal feedback element to amplifier 301 at terminals A and B respectively, to cause said amplifier to oscillate, and the sound output of said transducer to excite cavity resonance within the hollow body 102 at a frequency related to dimension 108. Said cavity resonant signal in turn determines the frequency of oscillation of amplifier 301. As long as there is no intruder caused change in water level, said frequency is unvarying, and coupled to the input of phase locked loop 302, does not vary the D.C. level of output from 302 to cause an alarm actuating signal. However, when an intruder causes a rise in water level due to displacement, say to water level 107, then internal major dimension air space 108 decreases to dimension 109 with a consequent increase in cavity resonant and amplifier frequency. Said frequency change signal causes phase locked loop network 302 to have a negative going change in signal output which is filtered free of oscillation frequency by low pass filter R7, C4 and coupled through capacitor C5 to the inverting amplifier network including transistor Q1, and the output of said inverting amplifier connected to the base of transistor Q2, the input of said triggerable pulse forming network, to cause said network to emit a train of positive pulses of a time duration depending upon the magnitude of the change in water level. Said train of pulses is integrated by the integrator network R14, R15, C7, with R14 adjustable to control sensitivity, and the integrated positive voltage imposed upon the gate of SCR-1 to cause SCR-1 to latch in the conducting state and energize said alarm bell. Load resistor R16 sustains the current through the silicon controlled rectifier during the times the bell contacts are open, to prevent the SCR from turning off. Alarm persists until switch S1 is opened momentarily, to reset the apparatus.

Slow change in water level due to rain or evaporation is not sufficient to cause alarm and the apparatus stabilizes at the new water level.

Slow changes in water level due to rain or evaporation do not produce enough delta h in a short enough time interval to actuate the alarm.

It should be noted that Section AN46 of the publication "Linear Applications-Vol. 1," by National Semiconductor Corp. 1973 provides a detailed discussion of the Phase Locked Loop Integrated Circuit.

Referring now to FIG. 4, the circuit network of a second embodiment of the present invention, comprising the apparatus of both FIGS. 1 and 2 together with the circuit network to be described. The apparatus of FIG. 1 with terminals A and B connected to the respective terminals of the amplifier of FIG. 2, and output terminal B of said amplifier coupled through capacitor C1 to input terminal 2 of phase locked loop integrated circuit 402 comprising integrated circuit NSC 565, made by the National Semiconductor Corp. Said integrated circuit is utilized with bias resistors R1, R2, programming resistors R3, R4, programming capacitor C2, bypass capacitor C3, a low pass network comprised of resistor R5 and capacitor C4. The signal output from terminal 7 of said phase locked loop network is connected through said low pass network and current limiting resistor R7 to the inverting input terminal 2 of operational amplifier 403, comprised of integrated circuit NSC-741 made by the National Semiconductor Corp. The signal output from terminal 7 of said phase locked loop is also connected to the input of an integrating network comprised of resistor R6 and capacitor C5, and the output of said integrating network is connected through current limiting resistor R8 to the non-inverting input terminal 3 of said operational amplifier 403. R9 null resistor is connected from terminal 3 to ground. Feedback resistor R10 is connected from output terminal 6 of amplifier 403 to input terminal 2 and functions as a gain control. The output of amplifier 403 from terminal 6 is connected across load resistor R12 and to the input of a triggerable, latching alarm switching network comprised of silicon controlled rectifier SCR-1, load resistor R11, and bypass capacitor C6. Alarm bell 404 is connected across load resistor R11. The apparatus is powered by batteries B1 and B2 connected through dual switch S1.

A third embodiment not shown is comprised of the apparatus of FIG. 4, with the exception that duct 103 of the apparatus of FIG. 1 is predetermined to offer minimum resistance to water flow, that is fully open so that hydraulic integration does not occur, and resistor R5 and capacitor C4 are now proportioned to comprise an integrating network instead of the former low pass network. The circuit configuration of this embodiment looks the same as that of the second embodiment, however, the change in proportion results in a different mode of operation.

Referring now to the second embodiment, in operation, the apparatus of FIG. 1 is shown mounted at pool side with body 102 half immersed to initial water level 106. When no intruder has entered the pool, the water level within the chamber of body 102 has an average and steady reference level, stabilized by the integrating action of said chamber water capacity together with said flow resistive duct. The air space above water within body 102 has a vertical dimension 108 comprising the largest internal dimension of said chamber which determines the lowest frequency of cavity resonance. Transducer 104 is connected as a signal feedback element to amplifier 401 at terminals A and B respectively, to cause said amplifier to oscillate, and the output sound of said transducer to excite cavity resonance within said hollow body 102 at a frequency related to dimension 108. Said cavity resonant signal in turn determines the frequency of oscillation of amplifier 401. As long as there is no intruder caused change in water level, said frequency is unvarying, and coupled to the input of phase locked loop 402, does not vary the D.C. level of output from 402 to cause an alarm actuating signal. However, when an intruder causes a rise in water level due to displacement, say to water level 107, then major internal dimension air space 108 decreases to dimension 109 with a consequent increase in cavity resonant and amplifier frequency. Said frequency change signal causes phase locked loop network 402 to have a negative going change in signal output. Prior to intrusion during the steady D.C. output from terminal 7 of the phase locked loop, capacitors C4 and C5 have been charged to that steady D.C. level and said equal levels imposed upon the differential inputs of the operational amplifier 403 so that the amplifier has no output signal, R9 having been adjusted to give zero output, and R3 adjusted to cause the internal oscillator in 402 to have approximately the frequency of cavity resonance. The negative going signal output of phase locked loop 402 at time of intrusion is filtered of cavity resonant frequency by low pass filter R5, C4 and impressed through current limiting resistor R7 upon terminal 2 inverting input of operational amplifier 403. The same phase locked loop output is impressed upon the input of integrator network R6, C5 and the output of said integrator connected to the non-inverting terminal 3 input of amplifier 403. Due to the time constant of said integrator, there is a time interval during which inverting input 2 of said amplifier has a negative input which triggers SCR-1 to the conducting state and energizes the alarm bell 404. Load resistor R11 sustains the current through SCR-1 during the time the bell contacts are open, to prevent the SCR from turning off. Alarm persists until switch S1 is opened momentarily to reset the apparatus.

Slow change in water level due to rain or evaporation is not sufficient to cause alarm and the apparatus stabilizes at the new water level.

Referring now to the third embodiment, in operation, the circuit network of a third embodiment looks identical to that of the second embodiment, however, the values of three parameters are herein changed to give a different mode of operation. First: water admitting duct 103 of FIG. 1 is now predetermined to offer minimum resistance to water flow so that there is no hydraulic integration in this embodiment, and water level within the chamber of body 102 now varies according to water wave action. The output signal of phase locked loop network 402 from terminal 7 now is a signal responsive to water waves but having an average level response to average water level. Second: the values of resistor R5 and capacitor C4 are increased so that the former low pass network becomes an integrator network with longer time constant than that of the prevailing water waves, but of shorter time constant than that of integrator network R6, C5. In the absence of an intruder capacitors C4 and C5 charge to the average D.C. potential output from terminal 7 of the phase locked loop 402 and the differential inputs of amplifier 403 see equal input signals, so that amplifier 403 has no signal output.

When an intruder in the pool causes a rise in water level due to displacement, although there is water wave rise and fall of level within the chamber of body 102, it is now at a higher average level and the frequency varying signal imposed upon the input of phase locked loop 402 has a higher average value, and therefore the output of said phase locked loop has a lower average D.C. level. The integrated D.C. change in level in the negative going direction reaches input 2 of the amplifier 403 before it reaches input 3 of said amplifier because of the longer time constant of the integrator in the input to terminal 3 than that in the input to terminal 2, so there is a time interval during which terminal 2 becomes more negative than terminal 3 and said amplifier has a positive output signal which triggers SCR-1 to the conducting state, and energizes alarm bell 404.

It should be noted that disclosure herein sets forth an intrusion detection apparatus for swimming pool or body of water which is activated by small change in average hydraulic head occurring because a person or object has caused a change in water displacement by changing the degree of immersion. A non-alarm state reference average hydraulic head is first determined by the present apparatus. Means are provided to detect a predetermined degree of departure, occurring during a predetermined time level, from said reference average hydraulic head, to produce an alarm activating signal upon said departure. Alarm indicating means, operable by said alarm activating signal, are provided to indicate that intrusion has occurred. Further means are provided to accommodate relatively large, long term changes in said non-alarm state reference hydraulic head, without requiring any adjustment of said apparatus. In the present apparatus, said reference hydraulic head is averaged over a time interval longer than the period of any waves or swells prevailing in the protected body of water.

In the instant invention, transducer sensed hydraulic head signals are integrated over a time interval which is long compared to the period of prevailing waves but short compared to the time for significant change due to rain, evaporation, or change in reference displacement. Detection of small average change in hydraulic head, several orders of magnitude smaller than prevailing wave amplitude, is accomplished by integrating transducer sensed signals over a predetermined time interval and comparing with value sensed and integrated over a different predetermined time interval.

Hydraulic integrating means are herein illustrated and described. Other embodiments are possible, taught by the present disclosure. Electrical network integrators, or combined electrical and hydraulic integrators are feasible in the present invention.

Figure 5:
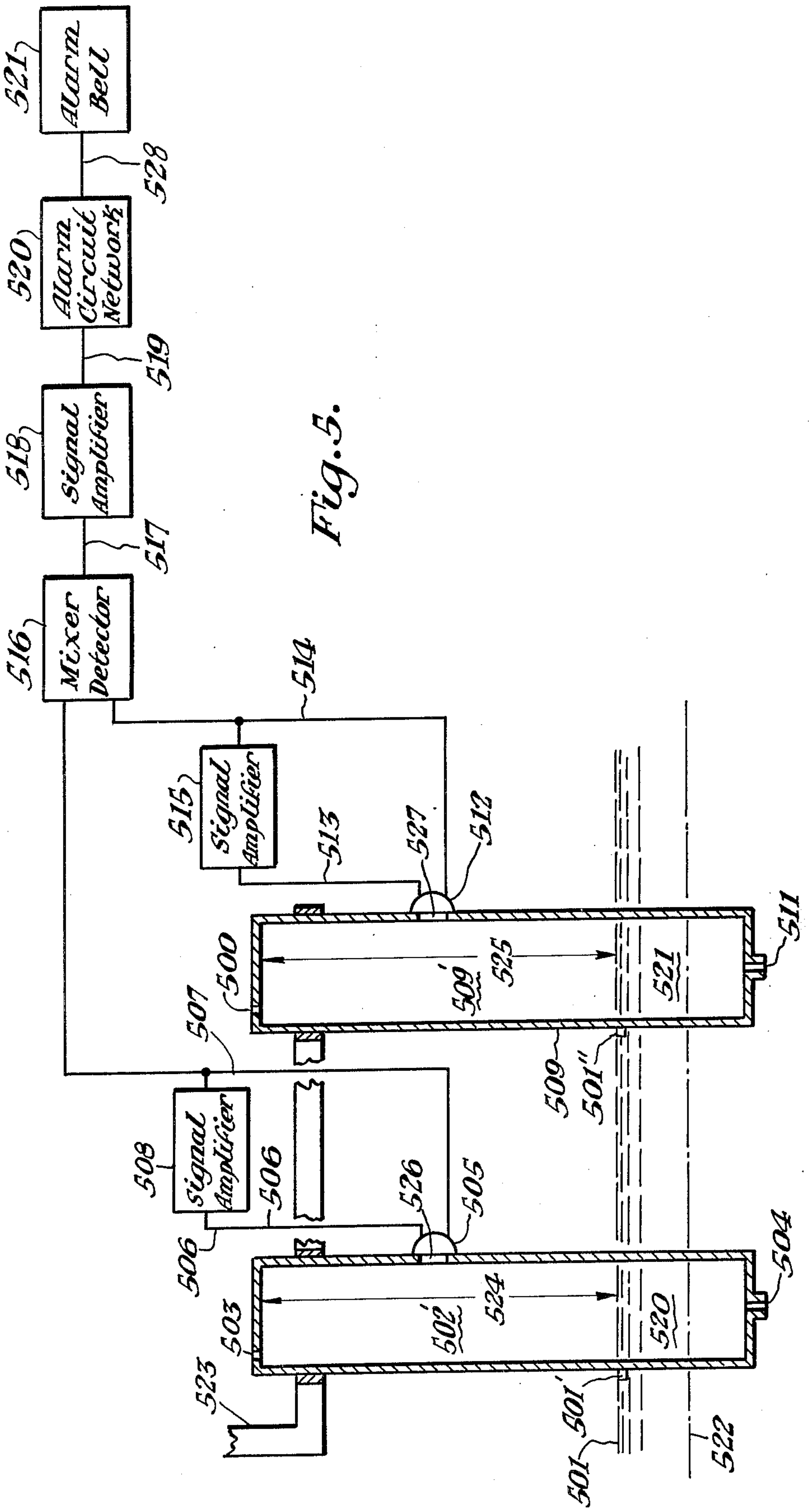
FIG. 5 depicts another embodiment, shown with differential hydraulic, sensing-integrating apparatus mounted partially immersed in swimming pool water, with longitudinal axis vertical, sectioned in a vertical plane. The electrical portion of this embodiment is shown in block diagram form.

Referring now to FIG. 5, another embodiment is illustrated, the cylindrical hollow housings 502 and 509, shown in vertical section, are each of predetermined internal volume and vertical internal dimensions 524 and 525 respectively. They are securely mounted with axis vertical by mounting bracket 523 from the side of the pool, and partially submerged in pool water so that mark 501' upon the outside of each housing, coincides with the greatest expected depth of water surface 501 in the pool. This insures that the pool water can drop as far as level 522 without causing internal dimensions 524 and 525 to exceed design range values, since dimensions 524 and 525 determine the frequency of resonance of airspace 502' and 509' respectively. Airspace 502' within housing 502 is vented to the atmosphere by a small hole 503, and airspace 509' within housing 509 is vented to the atmosphere by small hole 500, in order to equalize internal and external air pressures. The space within housing 502 is herein considered the primary chamber, and the space within housing 509 the secondary chamber. Water 520 within the primary chamber is admitted from the pool through primary duct 504 which offers a predetermined resistance to water flow. Water 521 within the secondary chamber is admitted from the pool through secondary duct 511 which offers predetermined resistance to water flow. Hole 526 is located in the sidewall of housing 502 at one half the average of dimension 524 above the surface of water 520, and hole 527 is similarly located at one half the average of dimension 525 above the surface of water 521 in the sidewall of housing 509. Reciprocal transducer 505 is mounted to cover hole 526, and reciprocal transducer 512 is mounted to cover hole 527. Transducer 505 is thus coupled to air column 502', and transducer 512 is coupled to air column 509'. Transducer 505 is connected as a feedback element into amplifier 508 network by wires 506 and 507, and transducer 512 is connected as a feedback element into amplifier network 515 by wires 513 and 514, causing amplifiers 508 and 515 to oscillate at the resonant frequency of each air column respectively. The signal outputs of amplifiers 508 and 515 are connected to the dual inputs 507 and 514 of network 516. Electrical network 516 comprises a mixer-detector or other network capable of giving an output signal only when the frequencies of its two input signals are not equal. The output of mixer-detector 516 is connected to the input of signal amplifier 518 by connection 517. The output of signal amplifier 518 is connected to the input of triggerable alarm circuit network 520 by connection 519. Alarm bell 521 operable by the output of network 520, when network 520 is triggered to the alarm state by a signal of predetermined amplitude from signal amplifier 518, is connected to the output of network 520.

Referring now to the apparatus of FIG. 5 in operation, when no intruder has entered the swimming pool water, the average water levels within the chambers of housings 502 and 509 and the water level of the pool are substantially equal. Said water level may be anywhere between 501 and 522 in FIG. 5, and for the purpose of the present invention this is the reference level, and only its state of equality is pertinent. Under the reference condition air columns 524 and 525 have been preselected equal. Coupled air column 524 and transducer 505 resonate to cause amplifier 508 to oscillate at the frequency for which dimension 524 is one half wave length. Since air columns of dimensions 524 and 525 are equal when there is no intrusion, then air column 525 coupled with transducer 512 resonate to cause amplifier 515 to oscillate at the same frequency as amplifier 508. Under this condition of equal frequency signal inputs mixer-detector 516 can have no output and there is no alarm actuation. When an intruder enters the swimming pool water, displacement causes the water level to rise slightly, and water flows into the primary fluid chamber 502' through primary duct 504, and into secondary fluid chamber 509' through secondary duct 511. Since the product $R_A V_C$ for the secondary fluid chamber has been preselected smaller than the $R_A V_C$ for the primary fluid chamber, referring to the curves and equation of FIG. 6, then at preselected time t the level of water in the secondary fluid chamber is delta h higher than the water in the primary fluid chamber, causing the air column of dimension 525 to be smaller than that of 524, so that column 525 with transducer 505 resonate at a higher frequency than column 524 with transducer 512. Now the two signal inputs to mixer-detector 516 are two unequal frequencies and mixer-detector 516 has a signal output to signal amplifier 518, whose output triggers the alarm circuit network 520 to the alarm condition, and sounds bell 521 to indicate an intrusion. If the pool water level changes from level 501 toward level 522 due to evaporation, or back again due to rain, the change is too slow to produce enough delta h (see FIG. 6) to cause an alarm. In this case the primary and secondary fluid levels remain substantially equal as they change and stabilize at a new reference level.

Signal amplifiers 508 and 515, shown in functional block diagram form in FIG. 5, each comprises known to the art operational amplifier LF13741 made by National Semiconductor Corp. Santa Clara, CA 95051, and herein utilized in the non-inverting A.C. amplifier circuit network shown on page 43 and FIG. 2.52 of the publication linear and Interface Circuit Applications, published by Texas Instrument Corp. in 1974. Included are necessary coupling, bias and power supply elements and connections. The signal output of amplifier 508 is connected to a first input of mixer-detector 516 by wires 507', and the signal output of amplifier 515 is connected to a second input of mixer-detector 516 by wires 514'. Mixer-detector 516, shown in functional block diagram form, comprises the known to the art electrical signal mixer-detector network shown and described in Electronic Circuits Design Casebook, pages 80 and 81, published in 1971 by McGraw-Hill Publishing Company, and includes necessary coupling, bias and power supply elements and connections. Mixer-detector 516 can have an output signal only when its two input A.C. signals are unequal in frequency, and said output is a D.C. voltage. The output of mixer-detector 516 is connected by wires 517 to the input of signal amplifier 518. Signal amplifier 518, shown in functional block diagram form, comprises a known to the art electrical signal amplifier network, operational amplifier SN 72709, made by Texas Instrument Corp. Dallas, Texas 75222, connected in the D.C. amplifier, non-inverting circuit network shown on page 41, FIG. 2.50 of the publication Linear and Interface Circuit Applications, published in 1974 by Texas Instruments Corp. and includes necessary coupling, bias and power supply elements and connections. The output of signal amplifier 518 is connected to the input of alarm circuit network 520 by wires 519. Alarm circuit network 520, shown in functional block diagram form, comprises the known to the art triggerable, latching alarm circuit network shown on page 425, upper diagram of FIG. 16.42, utilizing the described alternate input, triggerable by a positive signal voltage, in the publication Transistor Manual, Seventh Edition, 1964, published by General Eelctric Corp. and includes necessary coupling, bias and power supply elements, and connections, as well as a sensitivity control and a reset switch pushbutton. The output of alarm circuit network 520, comprising D.C. power supply voltage applied by relay contact closure in alarm circuit network 520, is connected to the input of alarm bell 521 by wires 528. Alarm bell 521, shown in functional block diagram form, comprises a known to the art bell, of voltage rating compatible with the apparatus power supply, exemplified by catalog number 275–498, sold by The Radio Shack Div. of Tandy Corp.

FIG. 6 is based on the equation as shown and described in the drawings.

The natural phenomena of cavity wave resonance utilized in the apparatus of the present invention are described in the following publications: SOUND by Alexander Efron, published by John Rider Publishing Co., 1957, page 58; REFERENCE DATA FOR ENGINEERS, 4th edition published 1956 by International Telephone and Telegraph Corp., see page 635.

The instant invention has been shown and described herein in what is considered to be the most practical and preferred embodiment. It is recognized, however, that departures may be made therefrom within the scope of the invention and that obvious modifications will occur to a person skilled in the art.

What I claim is:

1. In a swimming pool water intruder signal system, a device for sensing relative pool water level, comprising:

at least one body with a wave resonatable control cavity operatively coupled to pool water for sensing relative pool water level, and means for exciting resonant frequency waves in said cavity and for sensing said frequency at said pool water level and changes in said pool water level, said means including, at least one transducer, and at least one amplifier having an output and an input, said transducer operatively coupled to said cavity, said transducer connected to said output and said input of said amplifier to cause a regenerative oscillation signal in said amplifier, said oscillation signal at said output connected to drive said transducer to excite said resonatable control cavity and said resonant frequency wave to provide input to said transducer to drive said amplifier at said cavity resonant frequency, said amplifier provides at said output an electrical phase and frequency signal retracted to pool water level.

2. In a swimming pool water intruder signal system, a device as set forth in claim 1, wherein:

each said body with said cavity varying in size relative to pool water level, each said body includes a hydraulic water level integrating means operatively coupled to said pool water and said cavity, said integrating means for producing relative average pool water level in said cavity, said electrical phase and frequency signal related to the size of said cavity and to the relative average pool water level.

3. In a swimming pool water intruder signal system, a device as set forth in claim 2, including:

signal phase and frequency responsive means connected to said output for sensing a predetermined change in said output of said amplifier to produce a signal output responsive to a predetermined change in relative average pool water level in said pool.

4. In a swimming pool water intruder signal system, a device as set forth in claim 3 including, indicating means operatively coupled to the signal output of said signal phase and frequency change responsive means to produce an indication of said signal output change denoting intrusion.

5. A swimming pool intruder signal system comprising, means for sensing and indicating intrusion including a first body with resonatable cavity, said cavity vented to atmosphere and having a duct with predetermined resistance to water flow for admitting water to said cavity when placed in pool water;

a reciprocal sound transducer having an input and output operatively coupled to air space within said cavity for providing drive and an output signal;

an amplifier having an input and output, with said transducer connected to said amplifier input and output as a feedback element to cause said amplifier to oscillate at a frequency responsive to relative average water level as a function of cavity resonant frequency, an electrical means responsive to phase and frequency change, said electrical means including an input connected to said output of said amplifier to produce an alarm indicator activating signal output in response to a predetermined increase in relative average water level in said pool occurring within a predetermined time interval, said electrical means comprising a phase locked loop network with input coupled to the output of said amplifier a low pass filter network with input connected to the output of said phase locked loop network, a triggerable pulse forming network with input coupled to the output of said low pass filter network, a pulse summing network with input connected to the output of said pulse forming network, a latching switching network with input connected to the output of said pulse summing network, and an indicating device connected to the output of said switching network, and actuable by said network.

6. In a swimming pool intruder alarm, apparatus for sensing and indicating intrusion, comprising in combination; first, a body with resonatable cavity, said cavity vented to atmosphere and having a duct with a predetermined resistance to water flow for admitting water to said cavity; second, a reciprocal sound transducer operatively coupled to airspace within said cavity, and connected as a feedback element to an amplifier network to cause said amplifier to oscillate at a frequency responsive to relative average water level; third, an electrical network responsive to phase and frequency change, with input coupled to the output of said amplifier to produce an alarm activating signal output in response to a predetermined increase in relative average water level in said pool within a predetermined time interval, said network comprising a phase locked loop network with input coupled to the output of said amplifier, a low pass filter network with input connected to the outut of said phase locked loop network, a differential input amplifier with inverting input connected to the output of said low pass filter network, an integrator network with input connected to the output of said phase locked loop network, and the output of said integrator network connected to the non-inverting input of said differential input amplifier, a triggerable, latching, switching network with input connected to the output of said differential amplifier; and fourth, an alarm bell connected to and actuable by said switching network.

7. In a swimming pool intruder alarm, apparatus for sensing and indicating intrusion comprising in combination; first, a body with resonatable cavity, said cavity vented to atmosphere and having a submerged orifice for admitting water to said cavity; second, a reciprocal sound transducer operatively coupled to air space within said cavity, and connected as a feedback element to an amplifier to cause said amplifier to oscillate at a frequency responsive to water level; third an electrical network responsive to phase and frequency change, with input coupled to the output of said amplifier to produce a signal output responsive to varying water level in said pool, said network comprising a phase locked loop network with input coupled to the output of said amplifier, a first integrator network with input connected to the output of said phase locked loop, and output connected to the inverting input of a differential input amplifier, a second integrator network with input connected to the output of said phase locked loop and output connected to the non-inverting input of said differential amplifier, a triggerable, latching, switching network with input connected to the output of said differential amplifier; and fourth, an alarm bell connected to and actuable by said switching network.

8. A swimming pool intruder alarm system comprising, means for sensing and indicating intrusion including a first and a second body each with a resonatable cavity, said cavities each vented to atmosphere, said first body having a water admitting duct offering a first predetermined resistance to waterflow, and said second body having a water admitting duct offering a second predetermined resistance to water flow, said two bodies partially submerged in said pool, air in each of said body cavities coupled to a respective reciprocal transducer to drive each cavity to resonate and to sense said respective resonant frequencies, each of said transducers connected as a feedback element to a respective amplifier to cause said amplifiers to oscillate each at its respective frequency, the signal outputs of said amplifiers coupled to the two inputs of a frequency and phase responsive mixer-detector network, the output of said mixer-detector network coupled to the input of a signal amplifier, the output of said amplifier coupled to an alarm signal producing network, the output of said alarm signal producing network coupled to the input of an alarm indicating device.

* * * * *

UNITED STATES PATENT AND TRADEMARK OFFICE
CERTIFICATE OF CORRECTION

PATENT NO. : 4,189,722
DATED : February 19, 1980
INVENTOR(S) : Julius O. Lerner

It is certified that error appears in the above—identified patent and that said Letters Patent is hereby corrected as shown below:

Column 9, line 37, "retracted" should read -- related --.

Signed and Sealed this

*Twenty-seventh* Day of *May 1980*

[SEAL]

*Attest:*

SIDNEY A. DIAMOND

*Attesting Officer* *Commissioner of Patents and Trademarks*